United States Patent
Paul et al.

(10) Patent No.: US 9,069,922 B2
(45) Date of Patent: Jun. 30, 2015

(54) MODELING MEMORY CELL SKEW SENSITIVITY

(75) Inventors: Bipul C. Paul, Fishkill, NY (US); Randy W. Mann, Milton, NY (US); Anurag Mittal, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 513 days.

(21) Appl. No.: 13/490,096

(22) Filed: Jun. 6, 2012

(65) Prior Publication Data

US 2013/0332136 A1    Dec. 12, 2013

(51) Int. Cl.
G06F 17/50 (2006.01)

(52) U.S. Cl.
CPC ........ *G06F 17/5063* (2013.01); *G06F 17/5036* (2013.01)

(58) Field of Classification Search
CPC .................. G06F 17/5063; G06F 17/5036
USPC ...................................... 703/13–16
See application file for complete search history.

(56) References Cited

U.S. PATENT DOCUMENTS

| | | | |
|---|---|---|---|
| 2005/0043908 A1* | 2/2005 | Bhavnagarwala et al. | 702/64 |
| 2009/0164194 A1* | 6/2009 | Shrivastava et al. | 703/14 |
| 2009/0306953 A1* | 12/2009 | Liu et al. | 703/14 |
| 2010/0017186 A1* | 1/2010 | Kim et al. | 703/14 |

* cited by examiner

*Primary Examiner* — Eunhee Kim
(74) *Attorney, Agent, or Firm* — Amerson Law Firm, PLLC

(57) ABSTRACT

A method includes designating a cell mismatch parameter of a memory cell including a plurality of transistors and an initial value of a transistor mismatch parameter for each of the plurality of transistors. A critical current sensitivity parameter is determined for each of the plurality of transistors based on the transistor mismatch parameters in a computing apparatus. The cell mismatch parameter is distributed across the plurality of transistors in the computing apparatus to update the individual transistor mismatch parameters for each of the plurality of transistors based on the critical current sensitivity parameters and the cell mismatch parameter. The memory cell is simulated based on the individual transistor mismatch parameters to generate a simulation result.

20 Claims, 3 Drawing Sheets

MODELING MEMORY CELL SKEW SENSITIVITY

CROSS-REFERENCE TO RELATED APPLICATIONS

Not applicable.

BACKGROUND

The disclosed subject matter relates generally to semiconductor devices and, more particularly, to modeling memory cell skew sensitivity.

Modeling systems are widely used to simulate the performance of integrated circuits, such as metal-oxide-semiconductor field-effect transistors (MOSFETs) and combinations thereof. Device modeling allows designers to simulate the feasibility of circuit designs.

A commonly modeled integrated circuit device is a memory cell, such as a static random access memory (SRAM) cell. A typical SRAM cell includes three transistor pairs, a pass transistor pair, a pull-down transistor pair, and a pull-up transistor pair. Typically, transistors in the cell are fabricated to be substantially the same, but due to process variation, there is a mismatch for the threshold voltages of the transistors. The cell and/or transistor mismatches affect the stability of the memory cell.

SRAM modeling involves the use of statistical models that address the likely process variation and attempt to identify the operating parameters of the SRAM cell over the expected range of values. When evaluating an SRAM cell design, it is useful to simulate operation of the cell to determine read and write stability. Common stability parameters are access disturb margin (ADM) for read stability and write margin (WRM) for write stability. The margin of the cell is generally defined as a ratio between the critical current to maintain SRAM stability ($I_{CRIT}$) to the sigma of $I_{CRIT}$.

Typical modeling techniques for modeling cell margin assume a constant $I_{CRIT}$ sensitivity to transistor mismatch (i.e., threshold voltage skew between the paired transistors). However, because $I_{CRIT}$ sensitivity does vary with threshold voltage skew, this simplifying assumption introduces error into the simulation, thereby affecting design and hardware correlation.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes designating a cell mismatch parameter of a memory cell including a plurality of transistors and an initial value of a transistor mismatch parameter for each of the plurality of transistors. A critical current sensitivity parameter is determined for each of the plurality of transistors based on the transistor mismatch parameters in a computing apparatus. The cell mismatch parameter is distributed across the plurality of transistors in the computing apparatus to update the individual transistor mismatch parameters for each of the plurality of transistors based on the critical current sensitivity parameters and the cell mismatch parameter. The memory cell is simulated based on the individual transistor mismatch parameters to generate a simulation result.

Another aspect of the disclosed subject matter is seen in a computing apparatus including a processor programmed with instructions for performing a method for simulating a memory cell having a plurality of transistors. The method includes designating a cell mismatch parameter of a memory cell including a plurality of transistors and an initial value of a transistor mismatch parameter for each of the plurality of transistors. A critical current sensitivity parameter is determined for each of the plurality of transistors based on the transistor mismatch parameters in a computing apparatus. The cell mismatch parameter is distributed across the plurality of transistors in the computing apparatus to update the individual transistor mismatch parameters for each of the plurality of transistors based on the critical current sensitivity parameters and the cell mismatch parameter. The memory cell is simulated based on the individual transistor mismatch parameters to generate a simulation result.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
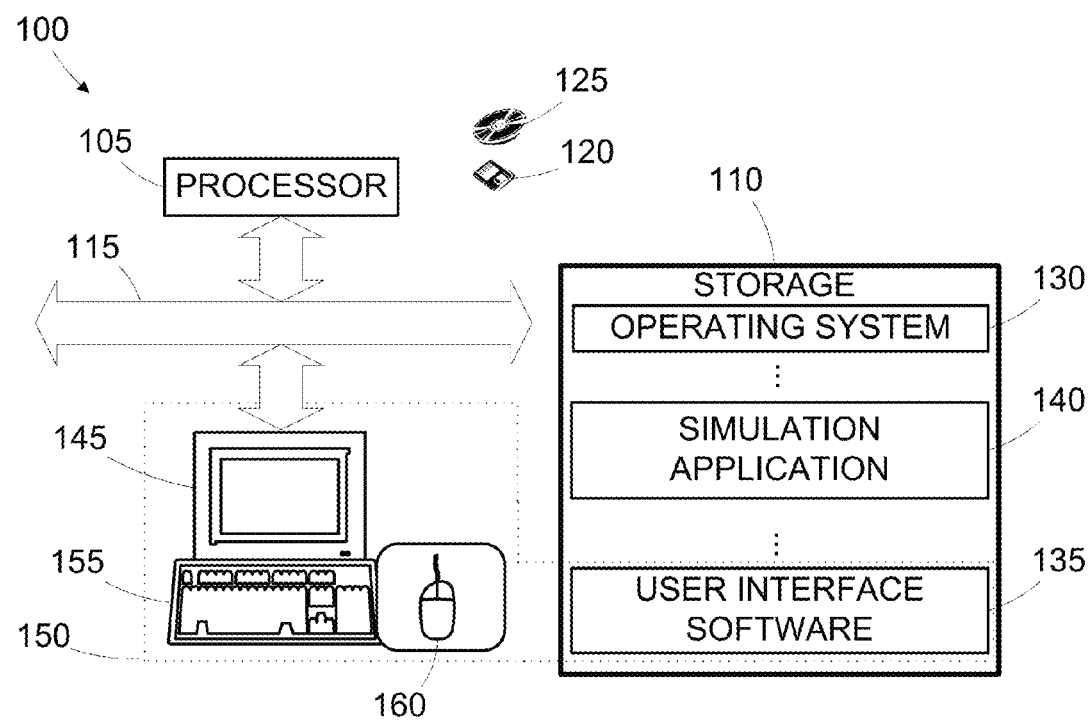
FIG. 1 is a simplified block diagram of a computing apparatus implementing a simulation application in accordance with one illustrative embodiment of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the disclosed subject matter shall be described in the context of a modeling computing apparatus 100. FIG. 1 provides a simplified diagram of selected portions of the hardware and software architecture of the computing apparatus 100 such as may be employed in some aspects of the present subject matter. The computing apparatus 100 includes a processor 105 communicating with storage 110 over a bus system 115. The storage 110 may include a hard disk and/or random access memory (RAM) and/or removable storage, such as a magnetic disk 120 or an optical disk 125. The storage 110 is also encoded with an operating system 130, user interface software 135, and a simulation application 140. The user interface software 135, in conjunction with a display 150, implements a user interface 150. The user interface 150 may include peripheral I/O devices such as a keypad or keyboard 155, mouse 160, etc. The processor 105 runs under the control of the operating system 130, which may be practically any operating system known in the art. The simulation application 140 is invoked by the operating system 130 upon power up, reset, user interaction, etc., depending on the implementation of the operating system 130. The simulation application 140, when invoked, performs a method of the present subject matter. The user may invoke the simulation application 140 in conventional fashion through the user interface 150. Note that although a stand-alone system is illustrated, there is no need for the data to reside on the same computing apparatus 100 as the simulation application 140 by which it is processed. Some embodiments of the present subject matter may therefore be implemented on a distributed computing system with distributed storage and/or processing capabilities.

Figure 2:
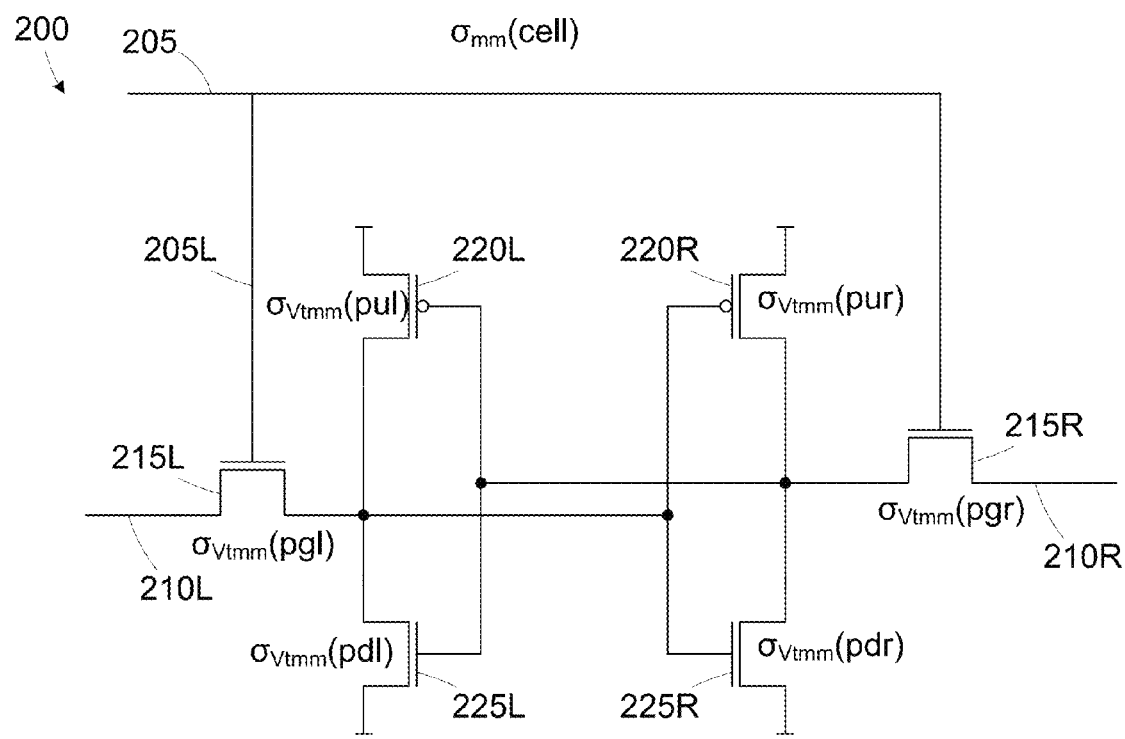
FIG. 2 is a diagram of a memory cell for which individual transistor mismatch parameters are determined by distributing a cell mismatch parameter.
Figure 3:
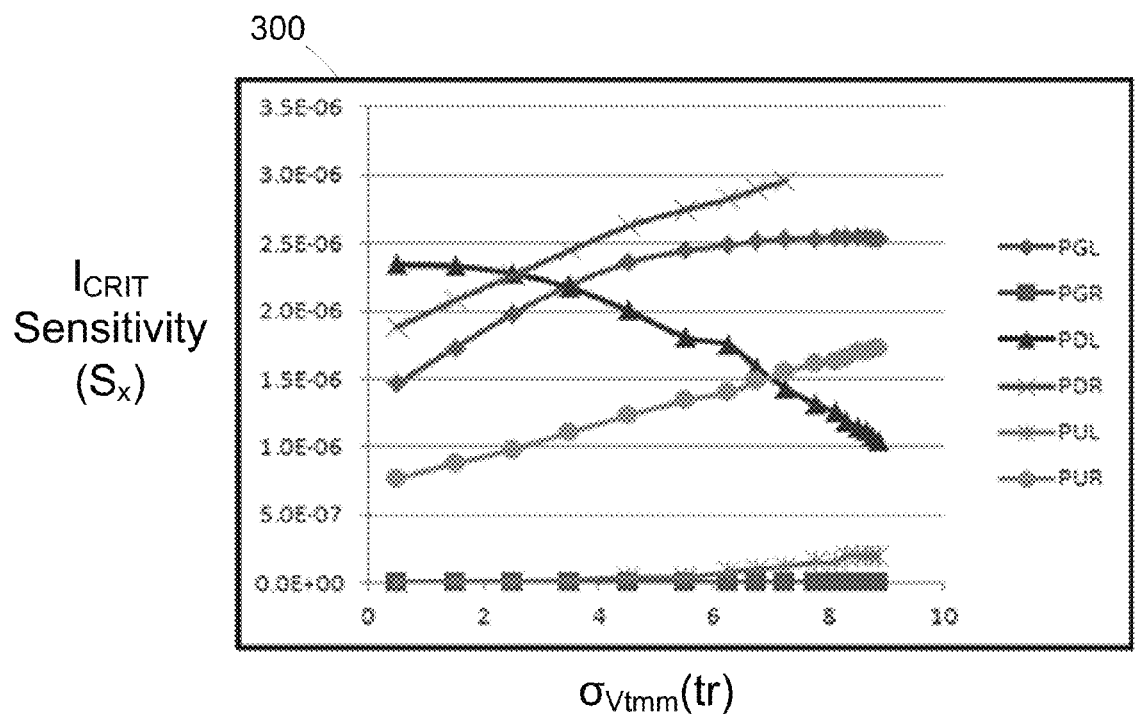
FIG. 3 is a diagram illustrating critical current sensitivity curves for the transistors in the memory cell of FIG. 2.
Figure 4:
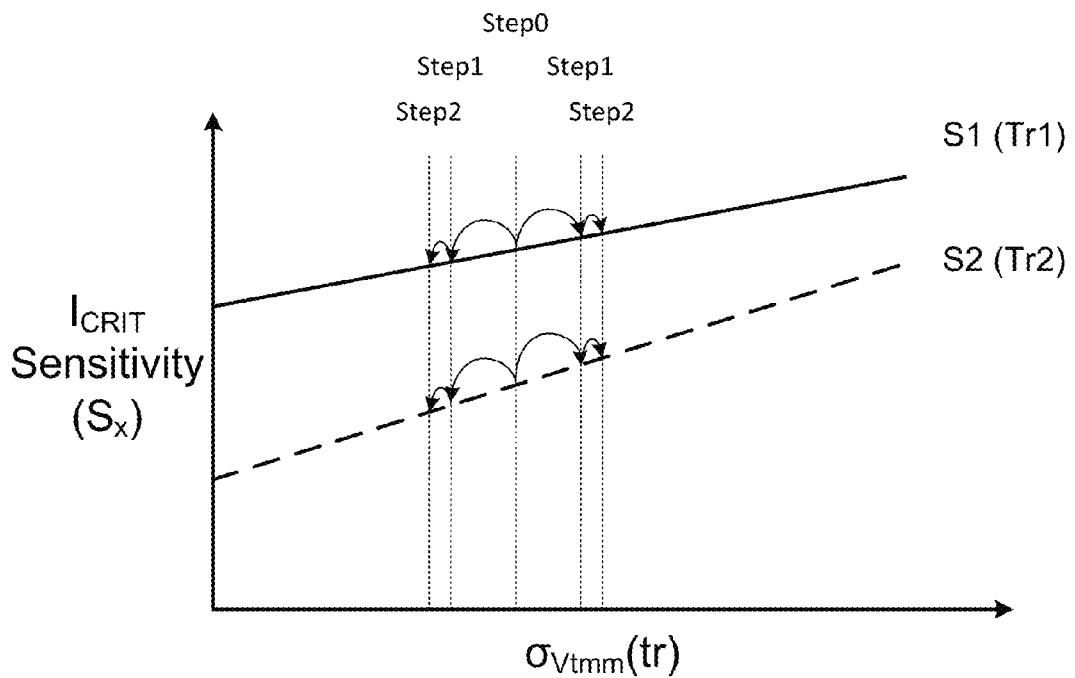
FIG. 4 is a diagram illustrating critical current sensitivity curves for a simplified example with two transistors.

It is contemplated that, in some embodiments, the simulation application 140 may be executed by the computing apparatus 100 to implement the device modeling techniques described herein with reference to FIGS. 2-4. Data for the simulation may be stored on a computer readable storage device (e.g., storage 110, disks 120, 125, solid state storage, etc.).

Turning now to FIG. 2, a diagram of an exemplary SRAM memory cell 200 is provided. The SRAM cell 200 includes a wordline 205, bit lines 210L, 210R, pass transistors 215L, 215R, pull-up transistors 220L, 220R, and pull-down transistors 225L, 225R. The cross-coupled pull-up transistors 220L, 220R, and pull-down transistors 225L, 225R define a storage element of the SRAM cell 200, and the pass transistors 215L, 215R are controlled by the wordline 205 to enable the storage element to be accessed for a read or write operation via the bit lines 210L, 210R. The SRAM cell 200 illustrated in FIG. 2 is a conventional 6T SRAM cell. Other memory cell topologies, may be used for the device simulation, such as a 4T cell. The principles of operation for an SRAM cell are known, so they are not described in detail herein.

To simulate the operation of the SRAM cell 200, the simulation application 140 employs nominal threshold voltages for each of the transistors and distributes an overall cell mismatch, $\sigma_{mm}(\text{cell})$ to generate individual transistor mismatches, $\sigma_{mm}(\text{tr})$. In determining the stability of the SRAM cell 200, the simulation application 140 determines the critical current, $I_{CRIT}$, of the cell. As will be described in greater detail below, the transistor mismatches are generated by statistically distributing the cell mismatch, $\sigma_{Vtmm}(\text{cell})$, to the individual transistors, while incorporating the dependency between $I_{CRIT}$ sensitivity and transistor skew. As shown in FIG. 2, the transistor mismatches are designated by $\sigma_{Vtmm}(\text{pul})$, $\sigma_{Vtmm}(\text{pur})$, $\sigma_{Vtmm}(\text{pdl})$, $\sigma_{Vtmm}(\text{pdr})$, $\sigma_{Vtmm}(\text{pgl})$, and $\sigma_{Vtmm}(\text{pgr})$, where "pu" designates the pull-up transistors 220L, 220R, "pd" designates the pull-down transistors 225L, 225R, and "pg" designates the pass transistors 215L, 215R.

As illustrated in reference to FIG. 3, the $I_{CRIT}$ sensitivity for each transistor is dependent on the transistor mismatch, $\sigma_{Vtmm}(\text{tr})$. The sensitivity curves provided in FIG. 3 are illustrative in nature. The sensitivity curves illustrated in FIG. 3 may be generated empirically for a particular process node by fabricating and measuring test devices. In other embodiments, an analytical sensitivity function may be derived by calculating or measuring the sensitivities at different sigma mismatch values, and subsequently, using a polynomial or a power law equation to fit the data. The data illustrated in FIG. 3 may be characterized generally as $I_{CRIT}$ sensitivity, $S_x$, for a given transistor is a function of transistor mismatch, $\sigma_{Vtmm}(\text{tr})$.

$$S_x = f(\sigma_{Vtmm}(tr)).$$

In the illustrative curves of FIG. 3, the sensitivity over the range from zero to four sigma is nearly linear. In one embodiment, the simulation application 140 uses a linear equation to approximate the sensitivity for each transistor. In other embodiments, a non-linear equation or a look-up table may be used.

Figure 5:
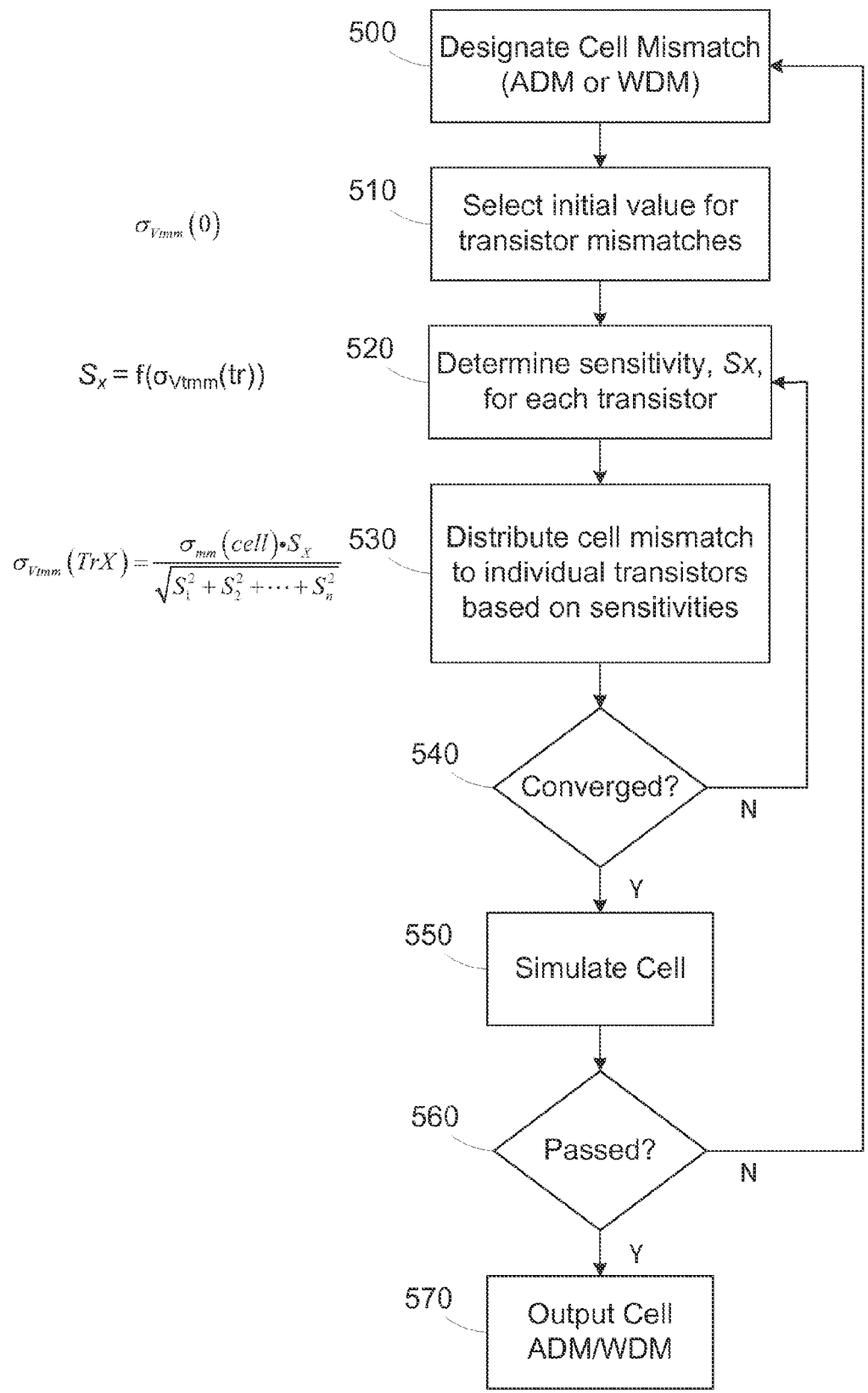
FIG. 5 is a simplified flow diagram of a method for determining a disturb margin of the memory cell of FIG. 2 in accordance with another illustrative embodiment of the present subject matter.

To illustrate the distribution of the cell mismatch across the transistors, a simplified example using two transistors will be discussed. FIG. 4 illustrates a simplified sensitivity curve for the two transistors, Tr1, Tr2. FIG. 5 illustrates a simplified flow diagram of a method for distributing the cell mismatch.

As will be discussed below, the method of FIG. 5 may be extended to cover any number of transistors, such as the 6 transistors 215L, 215R, 220L, 22R, 225L, 225R shown in FIG. 2.

In method block 500, the cell mismatch is designated. The cell mismatch may be an ADM or a WRM parameter. Typically, the margin of the cell 200 is determined by selecting a particular cell mismatch and simulating the cell operation to determine if it passes read and/or write tests and has acceptable yield. If the cell fails, the mismatch is incremented, and the simulation is repeated. The iterative simulation repeats until the cell 200 passes. The designated mismatch at the iteration where the cell fails represents the margin of the cell 200. The iterative approach may also start in the mismatch range where the cell passes, and iterate until the cell fails. In that case, the mismatch of the first failing iteration represents the cell margin. Using either approach identifies a boundary cell mismatch, where the cell passes at the boundary and fails at the next higher cell mismatch. This boundary cell mismatch represents the cell margin (e.g., ADM or WRM) of the cell 200.

In method block 510, initial values, $\sigma_{Vtmm}(0)$, for the transistor mismatches are determined. For example, the initial mismatches for all of the transistors may be set at 2 sigma. Using the sensitivity functions illustrated in FIG. 4 based on the initial transistor mismatches (i.e., step 0), the sensitivities for each transistor are determined in method block 520. As described above, linear or non-linear models or look-up tables may be used to approximate the sensitivity curves as a function of transistor mismatch.

Based on the sensitivities determined at step 0 using FIG. 4, the cell mismatch is distributed to the individual transistors in method block 530. The general equation for distributing the cell mismatch to n transistors is:

$$\sigma_{Vtmm}(TrX) = \frac{\sigma_{mm}(\text{cell}) \cdot S_X}{\sqrt{S_1^2 + S_2^2 + \ldots + S_n^2}}$$

Applying the general equation to the two transistor case illustrated in FIG. 4, provides specific equations for distributing the cell mismatch:

$$\sigma_{Vtmm}(Tr1) = \frac{\sigma_{mm}(\text{cell}) \cdot S_1}{\sqrt{S_1^2 + S_2^2}}$$

$$\sigma_{Vtmm}(Tr2) = \frac{\sigma_{mm}(\text{cell}) \cdot S_2}{\sqrt{S_1^2 + S_2^2}}$$

Based on the new calculated transistor mismatch values, the sensitivity values are updated using the sensitivity function of FIG. 4, as represented by step 1. The distributing of the cell mismatch to individual transistors and the determining of the sensitivity values in method blocks 520 and 530 are repeated (e.g., step 2 in FIG. 4) until the change in the transistor mismatches between iterations is less than a predetermined threshold. This condition represents convergence in method block 540.

Transistor mismatch equations may be defined for all of the transistors 215L, 215R, 220L, 22R, 225L, 225R in the cell. These equations may be used with the sensitivity functions represented in FIG. 3 to statistically distribute the cell mismatch.

$$\sigma_{Vtmm}(PUL) = \frac{\sigma_{mm}(\text{cell}) \cdot S_{PUL}}{\sqrt{S_{PUL}^2 + S_{PUR}^2 + S_{PDL}^2 + S_{PDR}^2 + S_{PGL}^2 + S_{PGR}^2}}$$

$$\sigma_{Vtmm}(PUR) = \frac{\sigma_{mm}(\text{cell}) \cdot S_{PUR}}{\sqrt{S_{PUL}^2 + S_{PUR}^2 + S_{PDL}^2 + S_{PDR}^2 + S_{PGL}^2 + S_{PGR}^2}}$$

$$\sigma_{Vtmm}(PDL) = \frac{\sigma_{mm}(\text{cell}) \cdot S_{PDL}}{\sqrt{S_{PUL}^2 + S_{PUR}^2 + S_{PDL}^2 + S_{PDR}^2 + S_{PGL}^2 + S_{PGR}^2}}$$

$$\sigma_{Vtmm}(PDR) = \frac{\sigma_{mm}(\text{cell}) \cdot S_{PDR}}{\sqrt{S_{PUL}^2 + S_{PUR}^2 + S_{PDL}^2 + S_{PDR}^2 + S_{PGL}^2 + S_{PGR}^2}}$$

$$\sigma_{Vtmm}(PGL) = \frac{\sigma_{mm}(\text{cell}) \cdot S_{PGL}}{\sqrt{S_{PUL}^2 + S_{PUR}^2 + S_{PDL}^2 + S_{PDR}^2 + S_{PGL}^2 + S_{PGR}^2}}$$

$$\sigma_{Vtmm}(PGR) = \frac{\sigma_{mm}(\text{cell}) \cdot S_{PGR}}{\sqrt{S_{PUL}^2 + S_{PUR}^2 + S_{PDL}^2 + S_{PDR}^2 + S_{PGL}^2 + S_{PGR}^2}}$$

Techniques for simulating the operation of the cell 200 based on the nominal threshold voltages and the distributed transistor mismatches are known to those of ordinary skill in the art, and therefore they are not described in greater detail herein. By iteratively determining the sensitivities and transistor mismatches, the effects of $I_{CRIT}$ sensitivity may be incorporated into the model, thereby improving the accuracy of the results.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   designating a cell mismatch parameter of a memory cell including a plurality of transistors and an initial value of a transistor mismatch parameter for each of the plurality of transistors;
   determining a critical current sensitivity parameter for each of the plurality of transistors based on the transistor mismatch parameters in a computing apparatus;

distributing the cell mismatch parameter across the plurality of transistors in the computing apparatus to update the individual transistor mismatch parameters for each of the plurality of transistors based on the critical current sensitivity parameters and the cell mismatch parameter; and simulating the memory cell based on the individual transistor mismatch parameters to generate a simulation result.

2. The method of claim 1, further comprising iterating the determining and the distributing until a change in the individual transistor mismatch parameters for a given iteration is less than a predetermined threshold.

3. The method of claim 1, wherein determining the critical current sensitivity parameters comprises employing a linear function relating transistor mismatch to sensitivity.

4. The method of claim 1, wherein determining the critical current sensitivity parameters comprises employing a non-linear function relating transistor mismatch to sensitivity.

5. The method of claim 1, wherein determining the critical current sensitivity parameters comprises employing a look-up table including entries relating transistor mismatch to sensitivity.

6. The method of claim 1, wherein distributing the cell mismatch to update the individual transistor mismatch parameters for each of the plurality of transistors based on the critical current sensitivity parameters and the cell mismatch parameter further comprises generating the individual transistor mismatch parameters using the equation $$\sigma_{Vtmm}(TrX) = \frac{\sigma_{mm}(\text{cell}) \Box S_X}{\sqrt{S_1^2 + S_2^2 + \ldots + S_n^2}},$$

where $\sigma_{mm}$ (cell) represents the cell mismatch parameter, X represents a given one of the transistors, $\sigma_{Vtmm}$ (TrX) represents the individual transistor mismatch parameter of the given transistor, S represents the critical current sensitivity parameter, and n represents a number of transistors in the memory cell.

7. The method of claim 1, wherein the memory cell comprises a synchronous random access memory cell.

8. A method comprising:

designating a cell mismatch parameter for a memory cell including a plurality of transistors and an initial value of a transistor mismatch parameter for each of the plurality of transistors;

determining a critical current sensitivity parameter for each of the plurality of transistors based on the transistor mismatch parameters in a computing apparatus;

distributing the cell mismatch parameter across the plurality of transistors in the computing apparatus to update the individual transistor mismatch parameters for each of the plurality of transistors based on the critical current sensitivity parameters and the cell mismatch parameter;

iterating the determining and the distributing until a change in the individual transistor mismatch parameters for a given iteration is less than a predetermined threshold;

simulating the memory cell based on the individual transistor mismatch parameters to generate a simulation result;

determining a boundary cell mismatch parameter by determining simulation results for a plurality of cell mismatch parameters; and determining a cell disturb margin of the memory cell based on the boundary cell mismatch parameter.

9. The method of claim 8, wherein determining the critical current sensitivity parameters comprises employing a linear function relating transistor mismatch to sensitivity.

10. The method of claim 8, wherein determining the critical current sensitivity parameters comprises employing a non-line function relating transistor mismatch to sensitivity.

11. The method of claim 8, wherein determining the critical current sensitivity parameters comprises employing a look-up table having entries relating transistor mismatch to sensitivity.

12. The method of claim wherein determining the boundary cell mismatch further comprises:

repeating the determining of the critical sensitivity parameters, the distributing of the cell mismatch parameter, the iterating, and the simulating for the plurality of cell mismatch parameters; and identifying the highest cell mismatch parameter having a passing simulation result as the boundary cell mismatch parameter.

13. The method of claim 8, wherein the memory cell comprises a synchronous random access memory cell.

14. The method of claim 8, wherein distributing the cell mismatch to update the individual transistor mismatch parameters for each of the plurality of transistors based on the critical current sensitivity parameters and the cell mismatch parameter further comprises generating the individual transistor mismatch parameters using the equation $$\sigma_{Vtmm}(TrX) = \frac{\sigma_{mm}(\text{cell}) \Box S_X}{\sqrt{S_1^2 + S_2^2 + \ldots + S_n^2}},$$

where $\sigma_{mm}$ (cell) represents the cell mismatch parameter, X represents a given one of the transistors, $\sigma_{Vtmm}$ (TrX) represents the individual transistor mismatch parameter of the given transistor, S represents the critical current sensitivity parameter, and n represents a number of transistors in the memory cell.

15. A computing apparatus, comprising a processor programmed with instructions for performing a method for simulating a memory cell having a plurality of transistors, the method comprising:

designating a cell mismatch parameter of the memory cell and an initial value of a transistor mismatch parameter for each of the plurality of transistors;

determining a critical current sensitivity parameter for each of the plurality of transistors based on the transistor mismatch parameters in a computing apparatus;

distributing the cell mismatch parameter across the plurality of transistors in the computing apparatus to update the individual transistor mismatch parameters for each of the plurality of transistors based on the critical current sensitivity parameters and the cell mismatch parameter; and simulating the memory cell based on the individual transistor mismatch parameters to generate a simulation result.

16. The computing apparatus of claim 15, wherein the processor is further programmed with instructions for iterating the determining and the distributing until a change in the individual transistor mismatch parameters for a given iteration is less than a predetermined threshold.

17. The computing apparatus of claim 15, wherein the processor is further programmed with instructions for determining the critical current sensitivity parameters by employing a linear function relating transistor mismatch to sensitivity.

18. The computing apparatus of claim 15, wherein the processor is further programmed with instructions for determining the critical current sensitivity parameters by employing a non-linear function relating transistor mismatch to sensitivity.

19. The computing apparatus of claim 15, wherein the processor is further programmed with instructions for determining the critical current sensitivity parameters by employing a look-up table having entries relating transistor mismatch to sensitivity.

20. The computing apparatus of claim 15, wherein the processor is further programmed with instructions for distributing the cell mismatch to update the individual transistor mismatch parameters for each of the plurality of transistors based on the critical current sensitivity parameters and the cell mismatch parameter by generating the individual transistor mismatch parameters using the equation $$\sigma_{Vtmm}(TrX) = \frac{\sigma_{mm}(\text{cell}) \cdot S_X}{\sqrt{S_1^2 + S_2^2 + \ldots + S_n^2}},$$

where $\sigma_{mm}$ (cell) represents the cell mismatch parameter, X represents a given one of the transistors, $\sigma_{Vtmm}$ (TrX) represents the individual transistor mismatch parameter of the given transistor, S represents the critical current sensitivity parameter, and n represents a number of transistors in the memory cell.

* * * * *

UNITED STATES PATENT AND TRADEMARK OFFICE
CERTIFICATE OF CORRECTION

PATENT NO.         : 9,069,922 B2  
APPLICATION NO.    : 13/490096  
DATED              : June 30, 2015  
INVENTOR(S)        : Bipul C. Paul et al.

Page 1 of 1

It is certified that error appears in the above-identified patent and that said Letters Patent is hereby corrected as shown below:

In the claims

Col. 8, lines 5-6 (claim 10), delete "non-line" and insert therefor -- non-linear --.

Col. 8, line 11 (claim 12), after "claim" insert -- 8, --.

Signed and Sealed this  
Eighth Day of December, 2015

Michelle K. Lee  
*Director of the United States Patent and Trademark Office*